United States Patent [19]

Okibayashi et al.

[11] Patent Number: 4,641,359
[45] Date of Patent: Feb. 3, 1987

[54] TWO-DIMENSIONAL IMAGE READ-OUT DEVICE

[75] Inventors: Katsushi Okibayashi, Ikoma; Masataka Itoh, Tenri; Shohichi Katoh, Yamatokoriyama, all of Japan

[73] Assignee: Sharp Kabushiki Kaisha, Osaka, Japan

[21] Appl. No.: 629,339

[22] Filed: Jul. 10, 1984

[30] Foreign Application Priority Data

Jul. 11, 1983 [JP] Japan .................. 58-126317

[51] Int. Cl.$^4$ .............................. G06K 9/28
[52] U.S. Cl. .................. 382/68; 250/211 R; 250/578
[58] Field of Search .......... 382/68; 250/211 R, 211 J, 250/578, 237 R; 358/213; 357/244 R

[56] References Cited
U.S. PATENT DOCUMENTS 4,247,874 1/1981 Kos et al. .......... 250/211 J
4,431,913 2/1984 Sekimoto et al. .......... 250/211 R Primary Examiner—Anthony V. Ciarlante
Attorney, Agent, or Firm—Birch, Stewart, Kolasch & Birch

[57] ABSTRACT

A two-dimensional image read-out device comprising a photoconducting layer, a plurality of X stripe electrodes applied on one surface of the photoconducting layer and arranged parallel with each other, and a plurality of Y electrodes applied on the other surface of the photoconducting layer and arranged parallel with each other in a direction perpendicular to the X electrodes. Both the X and Y electrodes are made of electrically conductive material, and the X or Y electrodes through which light from an image enters are made of transparent or translucent material. The light-entering side of the two-dimensional image read-out device is covered with an opaque material which allows the passage of light only through the picture elements which are formed at the intersections of the X and Y electrodes.

18 Claims, 8 Drawing Figures illuminance at the surroundings

TWO-DIMENSIONAL IMAGE READ-OUT DEVICE

BACKGROUND OF THE INVENTION

1. Field of the Invention

The present invention relates to a two-dimensional image read-out device, and more particularly to an image read-out device wherein a photoconducting layer is formed in a two-dimensional plane as wide as the read-out region of the device.

2. Description of the Prior Art

A two-dimensional image read-out device converts a two-dimensional pattern of light into an electric signal, and has been used in an image processing appliance to read out images such as characters and drawings on a manuscript. A compact two-dimensional image read-out device is available which makes use of the photoconductivity of a semiconductor film such as CdSe and amorphous Si.

FIG. 2 is a sectional view of this type of prior art two-dimensional image read-out device. On an electrically insulating substrate 1, X stripe electrodes 2, a photoconducting layer 3, and Y stripe electrodes 4 are applied successively. The X stripe electrodes 2 are arranged parallel to each other with a constant pitch. The Y stripe electrodes 4 are arranged similarly parallel to each other with a constant pitch, but in a direction perpendicular to the X electrodes 2. Each intersection between the X and Y electrodes forms a picture element. An X-Y matrix of picture elements detects a two-dimensional pattern of light from an image to be read out. If the Y electrodes 4 are made transparent or translucent, picture elements are exposed to the light from above through the Y electrodes 4.

This type of a two-dimensional image read-out device can convert the intensity of the incident light into an electric signal as follows. A two-dimensional image read-out device which can be made as wide as a manuscript is set just above the manuscript, with a lens interposed therebetween. The light from an image on the manuscript enters the picture elements, and the resistance between the X and Y electrodes through the photoconducting material in each picture element changes with the intensity of the incident light on the picture element. The change in resistance is by a circuit shown in FIG. 1. An external voltage is applied between either the X or Y electrode and a load resistance $R_L$ via the photoconducting layer and the other of the Y or X electrode. Then, an output signal which is proportional to the current flowing across the load resistance varies as the incident light on a picture element becomes light or dark. That is, an image is distinguished as being light or dark by each picture element in a two-dimensional array of picture elements.

Since the prior art two-dimensional image read-out device has such a structure as shown in FIG. 2, the current flows in two kinds of paths through the photoconducting layer 3 between the X electrode 2 and the Y electrode 4. When the light is incident on the picture element, the current flows along the intended path, that is, through the picture element. On the other hand, if the light is incident near the picture element at the same time, the current flows also in a circuitous path, that is, through a photoconducting material surrounding the picture element, the electric resistance of which is lowered by the incident light. In other words, the output signal is not only ascribable to the intensity of the light incident on the picture element, but the effect of the leakage current on the output signal should also be taken into account. Thus, the dynamic range of the conversion from a light signal to an electrical signal cannot be set too large because it necessarily enhances the instability of the output signal. If the intensity of the light surrounding the picture element becomes large while the intensity of the light at the picture element itself is low, a malfunction will occur. Namely, an output signal which should correspond to the dark state is transformed to a signal corresponding to the light state. If the Y electrodes are made of a material with low light transmissinity, the intensity of the light entering a picture element through the Y electrode to the photoconducting layer diminishes and the above-described trouble is enhanced.

An object of the present invention is to overcome the abovementioned troubles with a two-dimensional image read-out device, or to provide a two-dimensional image read-out device wherein the passage of light is obstructed at the surroundings of picture elements so that the dynamic range can be set large.

SUMMARY OF THE INVENTION

In accordance with the present invention, a two-dimensional image read-out device comprises a photoconducting layer, a plurality of X stripe electrodes applied on one surface of the photoconducting layer and arranged in parallel with each other, and a plurality of Y electrodes applied on the other surface of the photoconducting layer and arranged in parallel with each other in a direction perpendicular to the X electrodes, the X and Y electrodes being made of electrically conductive material, wherein the X or Y electrodes into which the light from an image enters are made of a transparent or translucent material and the light-entering side of the two-dimensional image read-out device is covered with opaque material except for the picture elements which are located at the intersections of said X and Y electrodes.

In a two-dimensional image read-out device according to the present invention, the light from an image on a manuscript is allowed to enter the picture elements, whereas the light is prevented from entering into the surrounding region of the picture elements so that the leakage current in the photoconducting layer is suppressed.

An advantage of the present invention is that output signals of picture elements are faithful to the exposed image to be read out, and that the precision of the read-out signal is improved.

BRIEF DESCRIPTION OF THE DRAWINGS

The objects and features of the invention may be understood with reference to the following detailed description of illustrative embodiments of the invention, taken together with the accompanying drawings, in which.

DETAILED DESCRIPTION OF THE EMBODIMENTS

Figure 1:
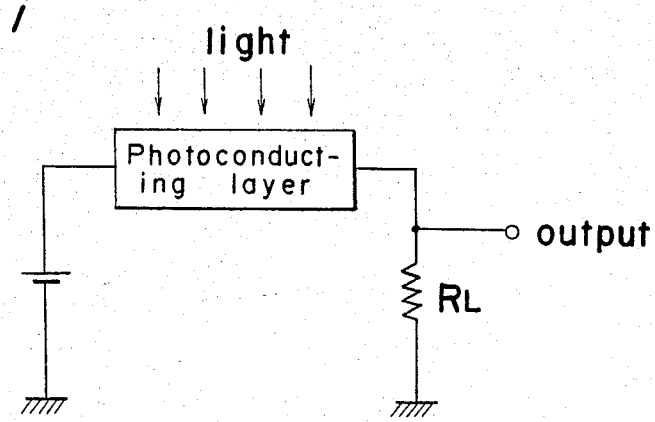
FIG. 1 is a block diagram explaining the action of a two-dimensional image read-out device.
Figure 2:
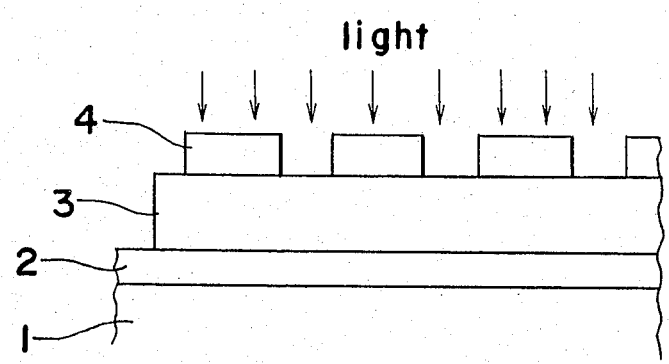
FIG. 2 is a schematic sectional view of the prior art two-dimensional image read-out device.
Figure 3:
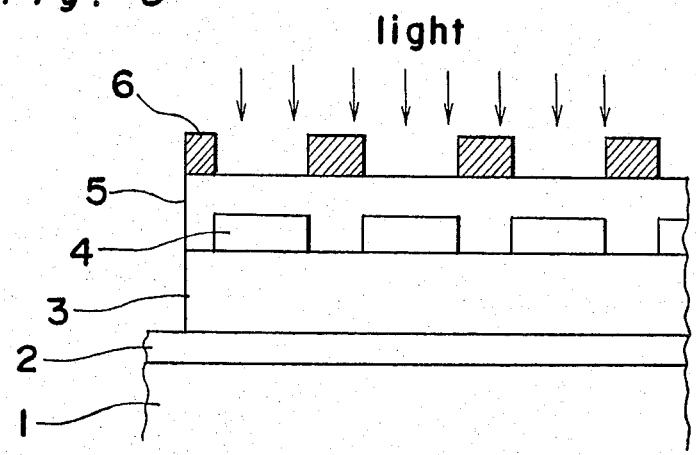
FIG. 3 is a schematic sectional view of a first embodiment according to the present invention.

A schematic sectional view of a first embodiment of a two-dimensional image read-out device according to the present invention is shown in FIG. 3. A plurality of stripe X electrodes 2, which are parallel to each other and at a constant pitch, are formed on an electrically insulating substrate 1 of glass-epoxy resin plate by etching copper foil of a thickness of about 10 μm applied on the substrate 1. A photoconducting layer 3 is applied on both the X electrodes 2 and the substrate 1, as wide as the read out area of the device. A photoconducting layer 3 wherein CdSe pigment is dispersed in acrylic resin is formed to a thickness of about 20 μm with painting (the blade process). A plurality of translucent Y electrodes 4 of gold of thickness of about 300 Å which are parallel to each other and at a constant pitch, are applied on the photoconducting layer 3 by evaporating with a mask. Then, a transparent insulating layer 5 of acrylic resin of thickness of about 10 μm is applied with painting (the blade process) on the Y electrodes 4 and the photoconducting layer 3. Finally, opaque stripe masks 6 of Al film of thickness from 0.5 to 1 μm, which are parallel to each other, are applied on the transparent insulating layer 5 by evaporating with a mask. The opaque masks 6 are not situated over the Y electrodes 4 so that they can shade a part of the photoconducting layer 3 not covered by the Y electrodes 4.

If the light from an exposed image on a manuscript enters a two-dimensional image read-out device with the abovementioned structure covered by masks 6, the light will enter only at the intersections of X electrodes 2 and Y electrodes 4, that is, at the picture elements, which are not shaded by the masks 6. The output signal which relates to the photoelectric conversion of the intensity of the incident light on each picture element is read out when the corresponding X and Y electrodes 2 and 4 are scanned.

Figure 4:
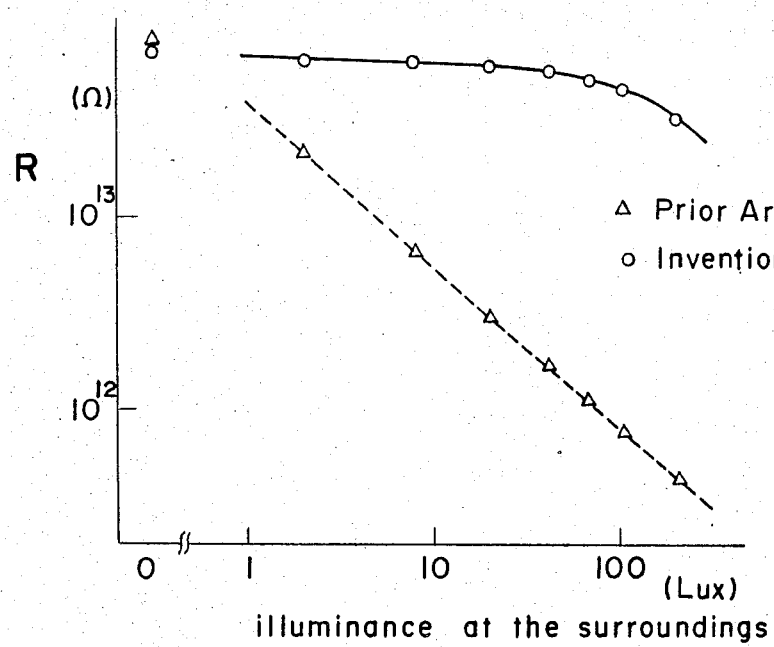
FIG. 4 is a graph of the resistance R plotted against the illuminance at the surroundings.

FIG. 4 shows experimental data which examines the effect of the abovementioned masks 6. The resistivity value R of a picture element in the dark state is plotted against the illuminance of the surroundings of the picture element; the solid line with circles designates data of the present embodiment, while the dashed line with triangles data of the prior art device not covered with the transparent insulating layer 5 and the opaque masks 6. In the experiments, the light is shed on the surroundings of the picture element under measurement but not on the picture element itself which is kept in the dark state. As is apparent in FIG. 4, the resistance R of the picture element of the prior art device decreases rapidly with the increase in illuminance of the surroundings due to the leakage current, whereas the resistance of the present embodiment does not substantially depend on the illuminance of the surroundings. The ratio of light current to dark current is definded as a ratio of the output current $I_L$ to the output current $I_D$, wherein the output current $I_L$ and $I_D$ are measured when a black and white manuscript are illuminated with white light of 100 lux, respectively. The ratio of light current to dark current is 43 dB in the prior art device, whereas it is 72 dB in the present embodiment, and it is clear that the present invention provides a factor of improvement as great as ten times over that of the prior art device.

The masks 6 can also be prepared, for example, by screen printing with insulating opaque paints. In this case which makes use of a printing process, the transparent insulating layer 5 need not be formed, and the insulating opaque paint can be printed directly between the Y electrodes 4.

The Y electrodes 4 can also be prepared with transparent conducting material such as ITO. It is better for a two-dimensional image read-out device to use transparent electrodes as the Y electrodes 4.

In a second embodiment of the present invention, a lattice-like mask 7 is made so as to shade a two-dimensional image read-out device except for the picture elements at the intersections of the X and Y electrodes. This is in contrast to the abovementioned first embodiment of the present invention wherein the opaque masks 6 are arranged over and between the Y electrodes 4, that is, in the shape of stripe like the Y electrodes 4. This type of shade mask 7 can obstruct more effectively the light incident on the device except for the light incident on the picture elements than the shade mask 6 in the first embodiment, and can further lessen the leakage current.

Figure 5:
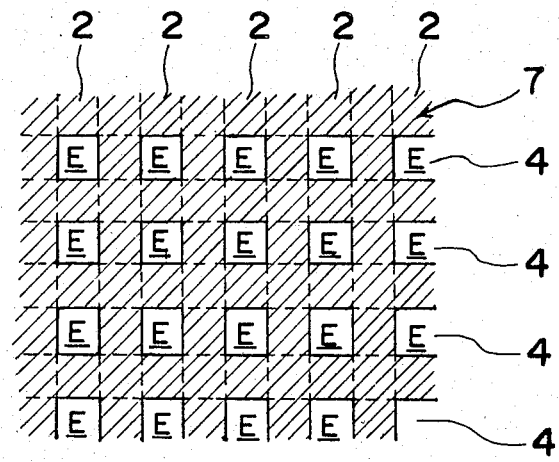
FIG. 5 is a schematic plan view of a second embodiment according to the present invention.

In a second embodiment of the present invention, as shown in FIG. 5, X electrodes 2, a photoconducting layer 3, translucent Y electrodes 4 of gold and an insulating layer 5 are successively applied on an insulating substrate 1, in a manner similar to the first embodiment of the present invention. Then, a lattice-like mask 7 of Al film of thickness from 0.5 to 1 μm (shaded region in FIG. 5) is evaporated on the insulating layer 5 except over the picture elements E at the intersections of the X and Y electrodes 2, 4. Consequently, the second embodiment of the present invention obstructs the passage of light except through the picture elements E arranged as an X-Y matrix of dots.

Figure 6:
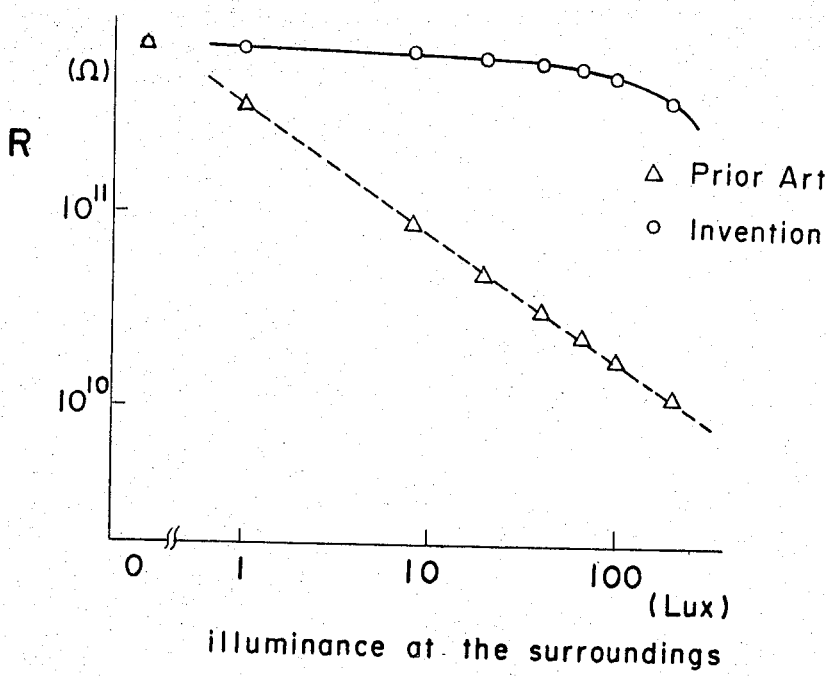
FIG. 6 is a graph of the resistance R plotted against the illuminance at the surroundings.

FIG. 6 shows experimental data which examines the effect of the shade mask 7. The resistivity value R of a picture element in the dark state is plotted against the illuminance at the surroundings of the picture elements; the solid line with circles designates data measured using the present embodiment, while the dashed line with triangles designates data measured using the prior art device not covered with the shade mask 7. In the experiments, the light enters through the surroundings of the picture element itself which is kept in the dark state. As is apparent from FIG. 4, the resistance R of the picture element of the prior art device decreases rapidly with the increase in the illuminance at the surroundings due to the leakage current, whereas the resistance of the second embodiment of the present invention does not substantially depend on the illuminance of the surroundings.

The shade mask 7 can also be prepared with insulating opaque paints for example by screen printing, and the Y electrodes 4 can also be prepared with transparent conducting material such as ITO, as in the first embodiment of the present invention.

As is apparent from FIGS. 4 and 6, in the prior art device which is not covered by a mask 7 or masks 6, the leakage current increases as the intensity of the incident light on the surroundings of a picture element under measurement changes, superficially. If the intensity of the light increases extremely, a malfunction occurs whereby the picture element is recognized erroneously to be in the light state though it is actually in the dark state. On the contrary, in the first and second embodiments covered with a mask 7 or masks 6, the superficial lowering of the resistance due to the leakage current is very small, and the device operates very stably.

The SN ratio defined as $20 \log_{10}(I_L/I_D)$ in the first embodiment with stripe masks 6 becomes twenty eight times as large as that of the prior art device, and that of the second embodiment with a lattice-like mask 7 becomes fifty times as large as that of the prior art. Thus, the application of a mask remarkably improves the stability and the SN ratio, and prevents malfunctions. The data also shows that the lattice-like mask 7 is more effective in suppressing the leakage current than the stripe masks 6.

Figure 7:
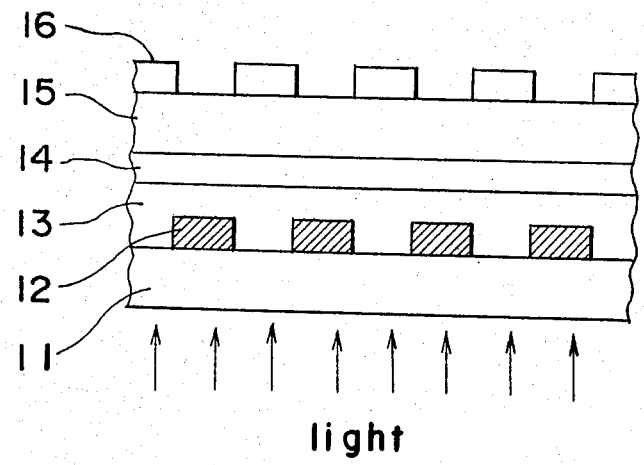
FIG. 7 is a schematic sectional view of a third embodiment according to the present invention.

FIG. 7 shows a third embodiment of the present invention. A plurality of stripe masks 12 of Al of thickness from 0.5 to 1 $\mu$m are evaporated on a transparent insulating substrate 11, and a transparent insulating substrate 13 of acrylic resin of a thickness of 10 $\mu$m is applied on the substrate 11 and the masks 12. A plurality of X stripe electrodes 14 of gold of a thickness of about 300 Å, which are parallel with each other and at a constant pitch, are evaporated on the transparent insulating layer 13. A photoconducting layer 15 of a thickness about 20 $\mu$m is applied on the X electrodes 14 and the transparent insulating layer 13 by painting CdSe pigment dispersed in acrylic resin. Finally, a plurality of Y stripe electrodes 16 of Al of a thickness of about 1 $\mu$m are evaporated on the photoconducting layer 15, the Y electrodes being parallel to each other and at a constant pitch in a direction perpendicular to the X electrodes 14. The masks 12 are situated below and between the Y electrodes 16. In this embodiment of the present invention, the light is incident on the transparent substrate 11, and it enters only between the stripe masks 12 to the photoconducting layer 14.

The shade mask can also be made in a lattice-like shape as in the second embodiment of the present invention. The shade mask 7 can also be prepared with insulating opaque paints, for example, by screen printing, and the Y electrodes 4 can also be prepared with transparent conducting material such as ITO, as in the first embodiment of the present invention.

Figure 8:
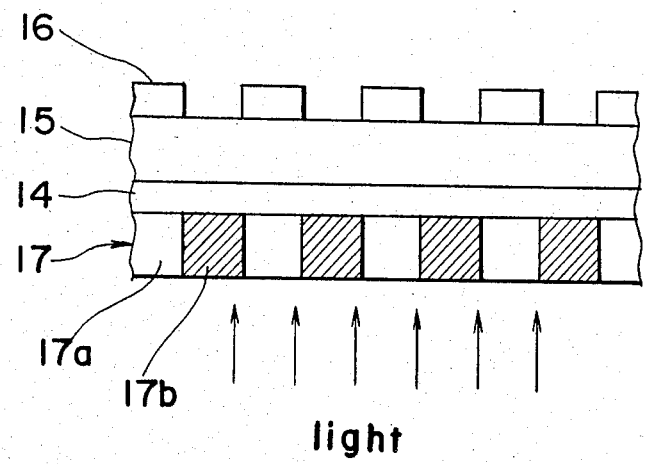
FIG. 8 is a schematic sectional view of a fourth embodiment according to the present invention.

FIG. 8 shows a fourth embodiment of the present invention. An insulating substrate 17 of resin film made from a transparent material and an opaque one so that the regions 17a which should correspond to the picture elements are transparent while the other region 17b is opaque. A plurality of X stripe electrodes 14 of gold of a thickness of about 300 Å, which are parallel with each other and at a constant pitch, are evaporated on the substrate 17. A photoconducting layer 15 of thickness about 20 $\mu$m is applied on the X electrodes 14 and the substrate 17 by painting CdSe pigment dispersed in acrylic resin. Finally, a plurality of Y stripe electrodes 16 of Al of a thickness of about 1 $\mu$m are evaporated on the photoconducting layer 15, the Y electrodes being parallel to each other and at a constant pitch in a direction perpendicular to the X electrodes 14. The X and Y electrodes 14, 16 are arranged so that the transparent regions 17a correspond to the picture elements. In this embodiment, the substrate 17 serves also as a lattice-like mask as in the second embodiment of the present invention. The light is incident on the substrate 17 and is transmitted through the transparent regions 17a to the picture elements. The opaque region 17b in the substrate can also be formed in a stripe-like shape.

Although the present invention has been fully described by way of example, it is to be noted here that various changes and modifications will be apparent to those skilled in the art. Therefore, unless such changes and modifications depart from the scope of the present invention, they should be construed as included therein.

We claim:

1. A two-dimensional image read-out device comprising:
   (a) a photoconducting layer having first and second surfaces;
   (b) a plurality of X electrodes shaped as stripes applied on the first surface of said photoconducting layer and arranged in parallel with each other; and,
   (c) a plurality of Y electrodes applied on the second surface of said photoconducting layer, opposite to the surface on which said X electrodes are applied, and arranged in parallel with each other in a direction perpendicular to said X electrodes;
   said X and Y electrodes being made of electrically conductive material, with at least one of said pluralities of said X or Y electrodes being made of transparent or translucent material to allow the passage of a light from an image through said one of said pluralities of said X or Y electrodes to said photoconducting layer;
   a side of said two-dimensional image read-out device upon which said light from said image is incident being covered by an opaque material except over a plurality of picture elements formed from said photoconducting layer which are positioned at the intersections of said X and Y electrodes.

2. A two-dimensional image read-out device according to claim 1, wherein said X electrodes, said photoconducting layer and said Y electrodes are applied successively on an electrically insulating substrate, and a transparent electrically insulating layer is applied on said Y electrodes and said photoconducting layer, wherein said opaque material is metallic film applied on said transparent electrically insulating layer.

3. A two-dimensional image read-out device according to claim 2, wherein said opaque material is of a lattice-like shape.

4. A two-dimensional image read-out device according to claim 2, wherein said opaque material is of a stripe-like shape.

5. A two-dimensional image read-out device according to claim 1, wherein said X electrodes, said photoconducting layer and said Y electrodes are applied successively on an electrically insulating substrate, and said opaque material is electrically insulating material applied on said Y electrodes and said photoconducting layer.

6. A two-dimensional image read-out device according to claim 5, wherein said opaque material is of a lattice-like shape.

7. A two-dimensional image read-out device according to claim 5, wherein said opaque material is of a stripe-like shape.

8. A two-dimensional image read-out device according to claim 1, wherein said opaque material is a metallic film applied on an electrically insulating substrate, with a transparent insulating layer being applied on said opaque material and said substrate, and wherein said X electrodes, said photoconducting layer and said Y electrodes are successively applied on said opaque material and said substrate.

9. A two-dimensional image read-out device according to claim 8, wherein said opaque material is of a lattice-like shape.

10. A two-dimensional image read-out device according to claim 8, wherein said opaque material is of a stripe-like shape.

11. A two-dimensional image read-out device according to claim 1, wherein said opaque material is an electrically insulating material applied on a transparent insulating substrate, and wherein said X electrodes, said photoconducting layer and said Y electrodes are applied successively on said mask and said substrate.

12. A two-dimensional image read-out device according to claim 11, wherein said opaque material is of a lattice-like shape.

13. A two-dimensional image read-out device according to claim 11, wherein said opaque material is of a stripe-like shape.

14. A two dimensional image read-out device according to claim 1, wherein said opaque material is an opaque region of an electrically insulating substrate which includes opaque and transparent regions, said transparent region being arranged to allow the passage of light at least to said picture elements, and wherein said X electrodes, said photoconducting layer, and said Y electrodes are applied successively on said insulating substrate.

15. A two-dimensional image read-out device according to claim 14, wherein said opaque material is of a lattice-like shape.

16. A two-dimensional image read-out device according to claim 14, wherein said opaque material is of a stripe-like shape.

17. A two-dimensional image read-out device according to claim 1, wherein said opaque material is of a lattice-like shape.

18. A two-dimensional image read-out device according to claim 1, wherein said opaque material is of a stripe-like shape.

* * * * *